(12) United States Patent
Hold

(10) Patent No.: US 7,339,842 B1
(45) Date of Patent: Mar. 4, 2008

(54) TIMING CONTROL FOR SENSE AMPLIFIERS IN A MEMORY CIRCUIT

(75) Inventor: Betina Hold, El Dorado Hills, CA (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 11/504,766

(22) Filed: Aug. 16, 2006

(51) Int. Cl.
*G11C 7/00* (2006.01)

(52) U.S. Cl. .................. 365/194; 365/207; 365/233

(58) Field of Classification Search ............. 365/196
See application file for complete search history.

(56) References Cited

U.S. PATENT DOCUMENTS

| | | | | |
|---|---|---|---|---|
| 3,778,784 A | * | 12/1973 | Karp et al. ............... | 365/233 |
| 3,906,463 A | * | 9/1975 | Yu ........................... | 365/182 |
| 5,625,595 A | * | 4/1997 | Ikeda ....................... | 365/194 |
| 5,627,789 A | * | 5/1997 | Kalb, Jr. ................... | 365/205 |
| 5,852,582 A | * | 12/1998 | Cleveland et al. ........ | 365/222 |
| 6,094,379 A | * | 7/2000 | Sago ......................... | 365/190 |
| 6,111,796 A | * | 8/2000 | Chang et al. ............. | 365/196 |
| 6,249,482 B1 | * | 6/2001 | Albon et al. ............. | 365/233 |
| 6,618,309 B2 | * | 9/2003 | DeMaris et al. ......... | 365/210 |

* cited by examiner

*Primary Examiner*—Tan T. Nguyen
(74) *Attorney, Agent, or Firm*—Nixon & Vanderhye P.C.

(57) ABSTRACT

An integrated circuit 18 includes a memory 20 having timing circuitry formed of a global controller 26 and a self-timing path for triggering the sense amplifiers 28 to read bit lines 30 within the array of bit cells 24. The self timing path includes timing cells 34 embedded within the array 24 and modelling behavior of the bit cells 32 in changing the bit line signals. The self timing path uses active low signalling throughout as this can be implemented with predominantly n-type transistors matching the n-type transistors which dominate within the array 24.

15 Claims, 3 Drawing Sheets

TIMING CONTROL FOR SENSE AMPLIFIERS IN A MEMORY CIRCUIT

BACKGROUND OF THE INVENTION

1. Field of the Invention

This invention relates to the field of integrated circuits. More particularly, this invention relates to integrated circuit memories having sense amplifiers and timing circuitry for controlling activation of those sense amplifiers at a controlled time following a read request.

2. Description of the Prior Art

It is known to provide integrated circuit memories with sense amplifiers for detecting bit line voltage changes when reading data from an array of bit cells and subsequently interpreting the data. The sense amplifiers typically consume a relatively large amount of power and accordingly it is desirable not to switch them on until necessary (e.g. when suitable voltage levels for a fast sense amplifier flip speed are present) and then switch them off when they have done their work. However, given the variations in process, voltage and temperature variations, as well as other variations, that can impact the performance and operation of an integrated circuit, the precise timing of switching on and switching off the sense amplifiers needs to adjust to take account of these factors. To this end, it is known to provide self timing paths as part of the timing circuitry within such integrated circuits.

FIG. 1 illustrates a known type of self timing path. An integrated circuit 2 includes a memory system 4 as well as other circuit elements such as a microprocessor core 6. A read request is generated and passed to a timing controller 8. The timing controller 8 initiates a set signal on signal line 12 which is dimensioned and routed in a manner which models the memory's word line and which propagates to a number of pull down transistors 10 which serve to pull down the voltage on a signal line 13 which is dimensioned and routed in a manner seeking to model the bit lines running through an array of bit cells 14. The propagation delay along the signal (delay) lines 12 and 13 and the action of the pull down transistors 10 is selected such that the reset input to the timing controller 8 will be received after a delay period following the read request; the delay period is intended to correspond to the amount of time after which the address decoding, word line selection and bit line driving operations (as well as other necessary operations) will have been performed for the array of bit cells 14 such that the bit line signals will be available for reading by the sense amplifiers 16. Accordingly, the timing controller 8 will then activate the sense amplifiers and reset itself ready to receive the next read request.

A problem with the system of FIG. 1 is that, in order to achieve high density within the array of bit cells 14, these are often formed with their own process and performance parameters which are different from those used in the rest of the integrated circuit 2. This enables high density and low power consumption to be achieved within the array of bit cells 14. However, a consequence is that the behaviour of the pull down transistors 10 and the signal (delay) lines 12 and 13 will not sufficiently accurately model the behaviour of the array of bit cells throughout the full range of process, voltage and temperature variations. Additionally, resetting the timing circuit 8 before the sense amplifiers 16 adds in additional logic delay not found in the true bit cell read path. Accordingly, additional margining is added into the operation of the timing controller 8 which reduces overall performance. These problems are becoming more significant as the size of the process geometries reduces to 90 nm and below. Additionally, whereas in the past limitations associated with read operation were dominant in constraining performance, write operations are now becoming limiting in some process/voltage/temperature parameter corner cases. A single functional delay path built to account for both worst case read and worst case write performance would be disadvantageously limiting. An assumption that read and write can be handled in the same way and with the same timing is no longer true at these process sizes and below.

SUMMARY OF THE INVENTION

Viewed from one aspect the present invention provides an integrated circuit memory comprising:

an array of bit cells having a plurality of bit lines carrying respective bit line signals;

a plurality of sense amplifiers coupled to respective bits lines and responsive to said bit line signals; and timing circuitry coupled to said array and said plurality of sense amplifiers and responsive to a read access request to activate at least some of said plurality of sense amplifiers to be responsive to respective bit line signals after a delay period following said read access request; wherein said time circuitry includes a self timing path having one or more timing cells embedded within said array and serving to model a bit cell of said array changing a bit line signal on a bit line.

The present technique recognises that forming the self-timing path to have one or more timing cells embedded within the array of bit cells itself and serving to model the action of the bit cells more accurately tracks the variation in performance of the bit cells thereby allowing a reduction in margining and improve performance as well as improve the liability. Furthermore, as the array changes sizes with different embodiments/instances of the memory design, then the self timing path will also change size to match the changes in the array.

In particular embodiments the timing cells and the bit cells are formed with components having common performance parameters, e.g. the same process geometries, sizes, doping techniques, etc.

The inclusion of the timing cells within the array itself also permits the use of a model row line and a model column line within the array to more accurately model signal propagation delays on word lines and bit lines.

The model column line can be arranged to run substantially through the centre of the array so that it more accurately represents the overall condition of the array.

A further feature of the present technique, at least in some embodiments, is that the self timing path activates the sense amplifiers before resetting of the timing circuitry. This more properly reflects the functional operation of the memory without adding additional logic entities which do not exist in the real read path and contrasts with the previous approaches in which the self timing path returned its signal to the timing controller with the timing controller then serving to activate the sense amplifiers. The self timing path thus models the datapath, sense operation, control, sense amplifier activation and clock reset in a more representative manner to the access operations of the memory.

The above feature is facilitated by the provision of local controller coupled to the model column line and serving to trigger the sense amplifiers.

A global controller will also be provided which is reset after the sense amplifiers have been activated so as to be ready to receive the next access request (whether that be a read or a write).

The behaviour of read accesses and write accesses can differ considerably at different process corners and accordingly at least some preferred embodiments include a separate self timing path coupled to the array and serving to separately model write accesses to the array. In this way, read accesses and write accesses may be separately controlled with respect to their timing.

It will be appreciated by those in this technical field that the transistors which dominate within the array of bit cells are mostly of an n-type. It will further be appreciated that processing and other variations can affect speed of n-type transistors and p-type transistors, e.g one type may be slowed and the other type speeded up. A particular combination which causes trouble is when the p-type transistors are relatively fast and the n-type transistors are relatively slow (i.e. an sf corner case). In this circumstance, if p-type transistors are used within the timing control circuitry whereas the bit cells themselves are dominated by n-type transistors, then the timing circuitry may try to initiate reading by the sense amplifiers before the bit cells have generated the appropriate signals due to the relatively slow nature of n-type transistors in that particular circuit. In order to address this issue, at least some preferred embodiments use all active low signalling within the timing circuitry. Active low signalling may be more readily implemented using n-type transistors which will likely be subject to the same process variations as the n-type transistors which form the bulk of the array of bit cells and so track their timing variation more closely.

The sense amplifiers can advantageously be arranged to be self-disabling in that they detect when a bit line signal has been detected by the sense amplifier at which point the sense amplifier turns itself off.

It will be appreciated that in order to increase speed and reduce power consumption it may be desirable to use multi-bank memories and the present technique is applicable to such arrangements which include a plurality of arrays of bit cells. In this context, the timing circuitry can include a local controller and local self timing path for each array, as well as a global controller shared by the plurality of arrays and set and reset by access requests.

Viewed from another aspect the present invention provides an integrated circuit memory comprising:

an array of bit cells having a plurality of bit lines carrying respective bit line signals;

a plurality of sense amplifiers coupled to respective bits lines and responsive to said bit line signals; and timing circuitry coupled to said array and said plurality of sense amplifiers and responsive to a read access request to activate at least some of said plurality of sense amplifiers to be responsive to respective bit line signals after a delay period following said read access request; wherein said time circuitry includes all active low signalling.

It will be appreciated by those in this field that the technique of active low signalling discussed above may be advantageously used independently of the provision of timing cells embedded within the array of bit cells.

Viewed from a further aspect the present invention provides a method of operating an integrated circuit memory comprising the steps of:

storing data values with an array of bit cells;

generating bit line signals indicative of said data values on bit lines running through said array;

sensing said bit line signals with a plurality of sense amplifiers coupled to respective bits lines;

generating a timing signal indicating a delay period using a self timing path having one or more timing cells embedded within said array and serving to model a bit cell of said array changing a bit line signal on a bit line following a read access request; and activating at least some of said plurality of sense amplifiers to be responsive to respective bit line signals after said delay period following said read access request.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
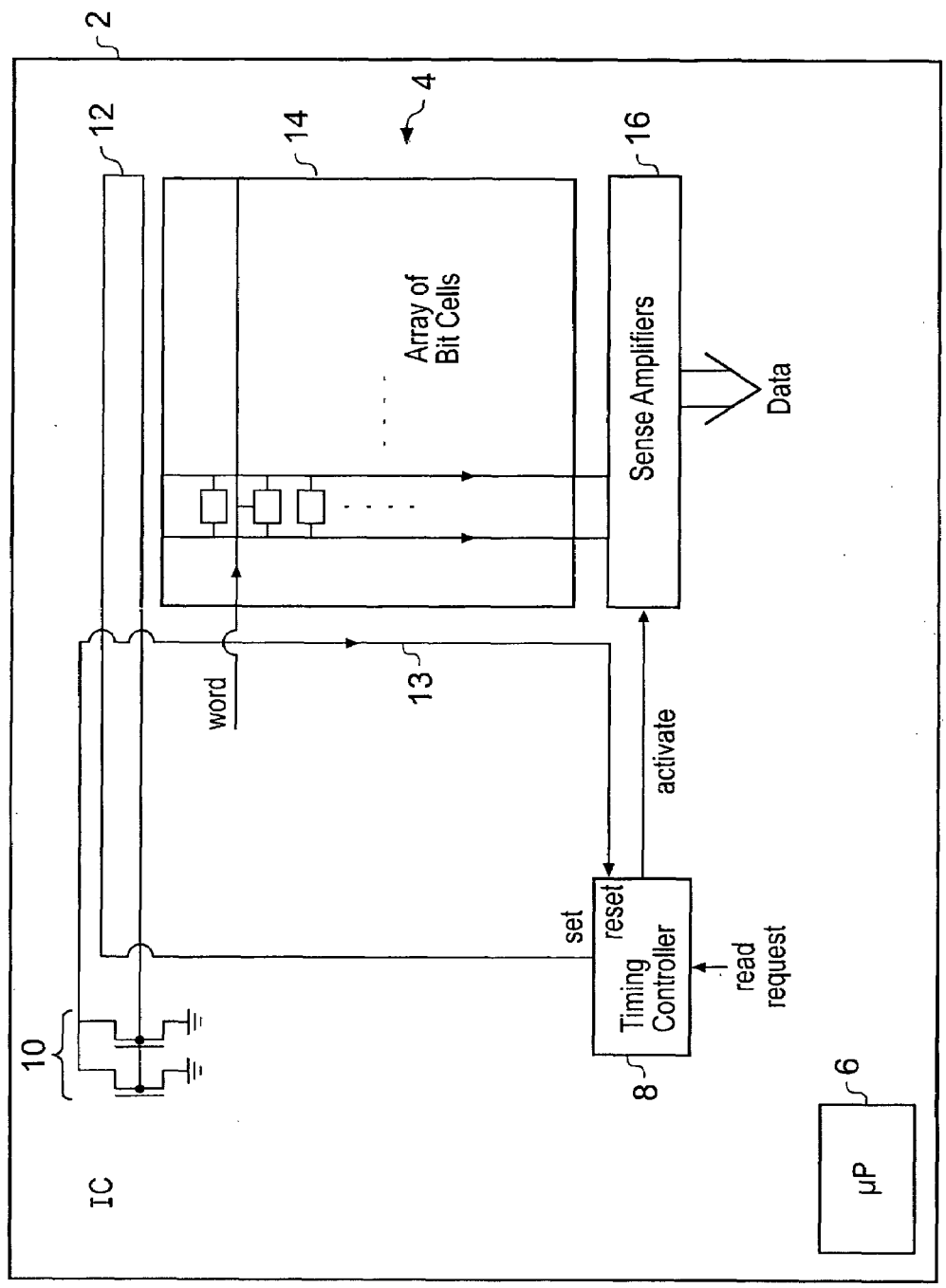
FIG. 1 schematically illustrates a known form of memory timing control.
Figure 2:
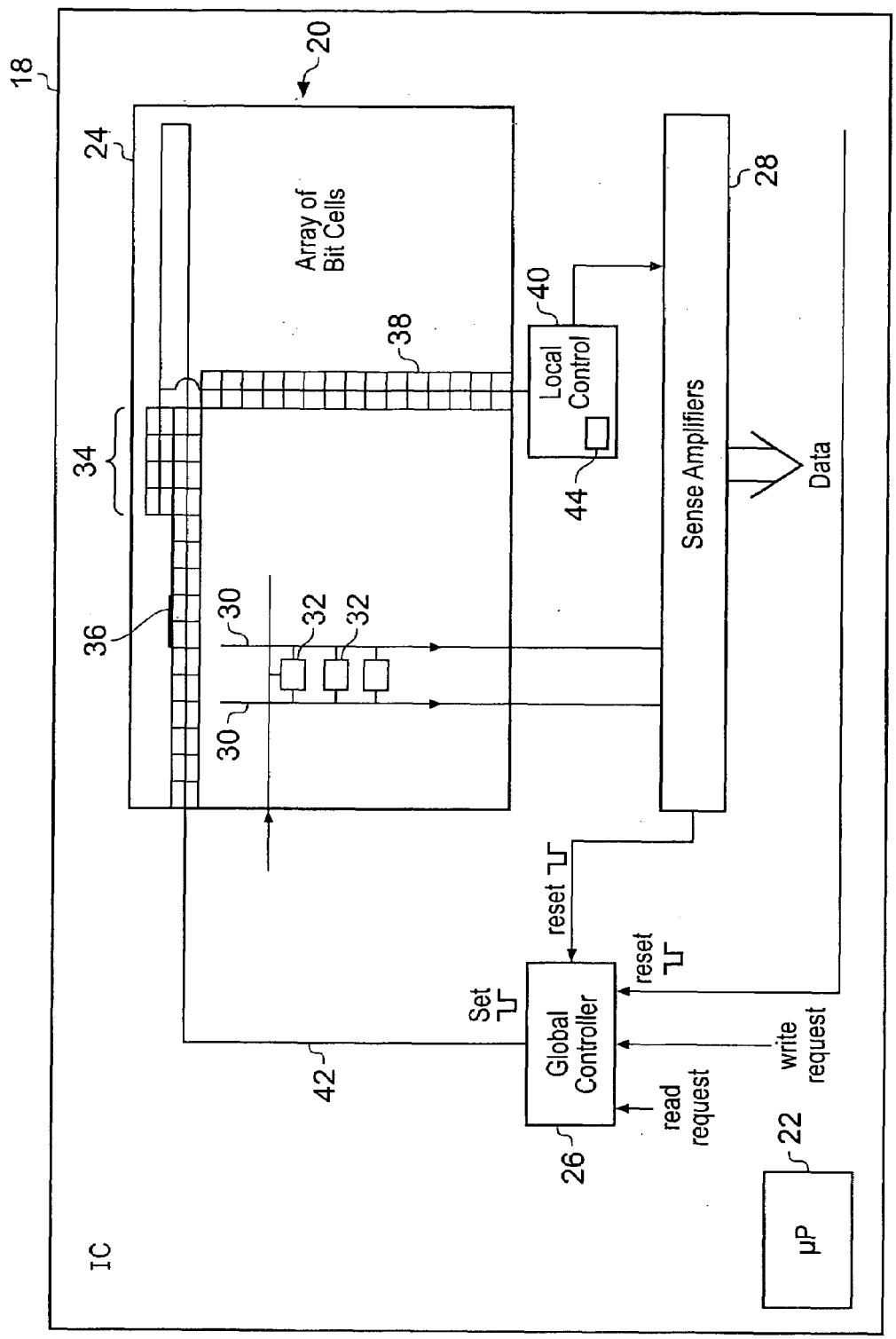
FIG. 2 schematically illustrates memory timing control using timing cells embedded within an array of bit cells.

FIG. 2 schematically illustrates an integrated circuit 18 including a memory portion 20 as well as other portions, such as a microprocessor 22. It will be appreciated that the present techniques may be used in integrated circuits which are purely memories as well as within integrated circuits, such as that illustrated in FIG. 2, where a variety of functional elements are provided within the integrated circuit 18 including a memory portion 20. This type of integrated circuit 18 including memory as well as various other components is becoming increasingly common and is sometimes referred to as a system-on-chip integrated circuit.

The memory portion 20 includes an array of bit cells 24, which are typically formed of cells in which n-type transistors dominate the functionality provided. The formation and operation of the array of bit cells 24 in itself is conventional, using word lines and bit lines. These conventional aspects of the operation of the array 24 will not be discussed further herein.

A global controller 26 serves to receive read requests and write requests as well as other inputs (not illustrated). One task of the global controller 26 is to serve as part of the timing circuitry for controlling the enabling of the sense amplifiers 28, which are to read the bit lines 30 coupled to the bit cells 32. In order to help adjust for process, voltage and temperature variations, the global controller initiates a signal to propagate along a self timing path which passes through a plurality of timing cells embedded within the array 24 namely word line capacitive load cells 36, pull down timing (speed) cells 34 and bit line capacitive load cells 38 (which also model worst case leakage from the data storage point of view). The word line load cells 36 are bit cells and serve to model capacitive word line load. These bit line load cells 38 modelling bit line behaviour may be formed with the same elements as are used to form the bit cells 32 and serve as a capacitive load and also seek to model worst case bit line behaviour (i.e. worst case delays caused by leakage by virtue of the data values stored). These bit line load cells 38 are formed from bit cells 32 by configuring or putting the cells of the bit cell 32 type in to a state (by a minor cell alteration) which slows propagation of the self timing signals. The timing cells 34 dictate the speed of the self timing path by their instance specific number of cells (e.g. this number can be altered when the array size is known and the memory is being compiled). These timing cells 34 are fixed in the state "0" and pull the model column low. The cells 34, 36 and 38 will accordingly have the same type of process geometry, doping levels and the like and accordingly be likely to suffer the same changes in performance with process, voltage and temperature as to the bit cells 32 and the other elements within the array 24. Accordingly, when the timing cells 34 serve to pull down the voltage on the model column line 38 to model the change in the bit line signal which will be produced by reading of a bit cell 32, then these will act about the same speed as the bit cells 32 and connections and accordingly model the action of the bit cells 32 connections. This modelling includes the strength of the bit cell 32 in changing the bit line signals as well as the speed propagation of those bit line signals.

A local controller 40 is responsive to the signal on the model column line 38. The local controller 40 when the model column line 38 is pulled low serves to activate the sense amplifiers 28 to read the bit lines 30 and drive out data values.

Also illustrated in FIG. 2 is a self timing write path 42 which similarly passes through the array 24 to the local controller 40 where a model write is attempted within a model cell 44. When this write is complete, this is signalled back to the global controller 26.

When either the sense amplifiers 28 have been activated and have detected a bit line signal change on the bit lines 30, or when a model write to the model write cell 44 has been made, then these occurrences are signalled back to the global controller 26 which is then reset. It will be appreciated that the global controller 26 is set by the access request and reset when the signals fed back to it indicate that the access request concerned has been made.

As illustrated in FIG. 2, the various set signals and reset signals which are passed around the self timing paths use active low signalling as this may be implemented using n-type transistors, which will then more accurately track the behaviour of the n-type transistors which dominate within the array 24.

Figure 3:
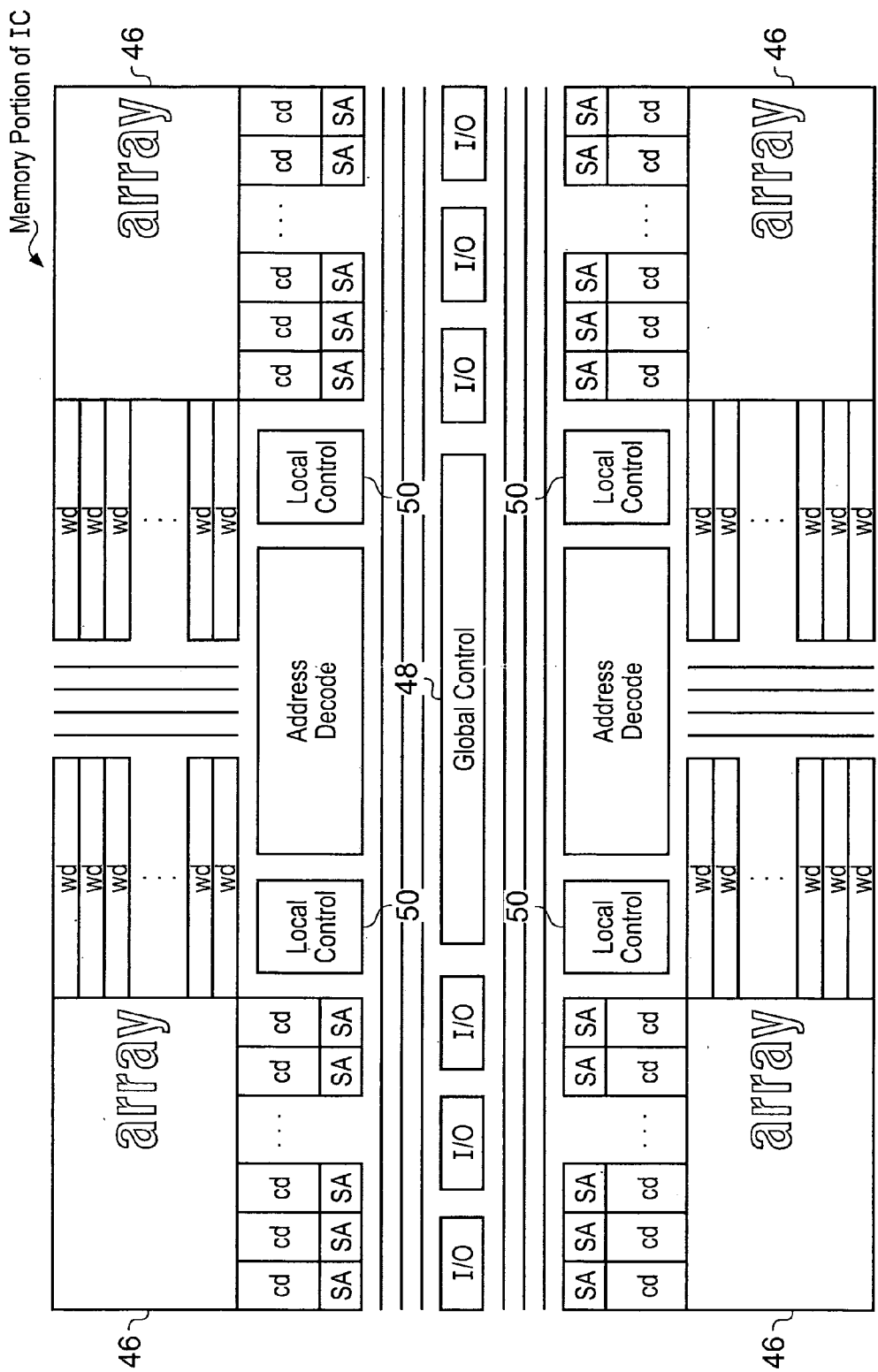
FIG. 3 schematically illustrates the layout of a memory portion of an integrated circuit including a plurality of arrays of bit cells.

FIG. 3 schematically illustrates the layout of a memory portion of an integrated circuit including multiple arrays of bit cells 46. Each array of bit cells has associated word decoders wd, column decoders cd and sense amplifiers SA. A global controller 48 is shared by all of the arrays 46 local controllers 50, which are provided for each of the arrays 46. The symmetrical and balanced layout illustrated in FIG. 3 leads to a balanced degree of performance within each of the arrays 46 and accordingly less impact due to margining being required to accommodate the worst case array or access path.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. An integrated circuit memory comprising:
   an array of bit cells having a plurality of bit lines carrying respective bit line signals;
   a plurality of sense amplifiers coupled to respective bits lines and responsive to said bit line signals; and
   timing circuitry coupled to said array and said plurality of sense amplifiers and responsive to a read access request to activate at least some of said plurality of sense amplifiers to be responsive to respective bit line signals after a delay period following said read access request; wherein
   said time circuitry includes a self timing path having one or more timing cells embedded within said array and serving to model a bit cell of said array changing a bit line signal on a bit line.

2. An integrated circuit memory as claimed in claim 1, wherein said one or timing cells and said plurality of bit cells are formed with components having common performance parameters.

3. An integrated circuit memory as claimed in claim 1, wherein said array includes a plurality of word lines and said self timing path includes a model row line a model column line and a predetermined number of pull down cells within said array to model signal propagation delays along a word line and a bit line during a read operation.

4. An integrated circuit memory as claimed in claim 3, wherein said model column line runs through substantially the centre of said array.

5. An integrated circuit memory as claimed in claim 3, wherein said timing circuitry includes a local controller coupled to said model column line and responsive to a change in signal on said model column line to trigger activation of said at least some of said plurality of sense amplifiers.

6. An integrated circuit memory as claimed in claim 3, wherein said timing circuitry includes a local controller and a self timing path for each array.

7. An integrated circuit memory as claimed in claim 6, wherein said timing circuitry include a global controller shared by said plurality of arrays, said global controller being coupled to said at least some of said plurality of sense amplifiers and triggered to be reset so as to be responsive to said next access request after said at least some of said plurality of sense amplifiers have been activated.

8. An integrated circuit memory as claimed in claim 1, wherein said self timing path activates said at least some of said plurality of sense amplifiers before resetting said timing circuitry to be responsive to a next access request.

9. An integrated circuit as claimed in claim 8, wherein said timing circuitry includes a global controller coupled to said at least some of said plurality of sense amplifiers and triggered to be reset so as to be responsive to said next access request after said at least some of said plurality of sense amplifiers have been activated.

10. An integrated circuit as claimed in claim 1, wherein said timing circuitry comprises a further self timing path coupled to said array and serving to separately model write accesses to said array.

11. An integrated circuit memory as claimed in claim 1, wherein said timing circuitry uses all active low signalling.

12. An integrated circuit memory as claimed in claim 1, wherein said plurality of sense amplifiers include control circuitry to disable said plurality of sense amplifiers in response to a bit line signal being detected.

13. An integrated circuit memory as claimed in claim 1, comprising a plurality of arrays of bit cells.

14. An integrated circuit memory comprising:
   an array of bit cells having a plurality of bit lines carrying respective bit line signals;
   a plurality of sense amplifiers coupled to respective bits lines and responsive to said bit line signals; and
   timing circuitry coupled to said array and said plurality of sense amplifiers and responsive to a read access request to activate at least some of said plurality of sense amplifiers to be responsive to respective bit line signals after a delay period following said read access request; wherein said time circuitry includes all active low signalling.

15. A method of operating an integrated circuit memory comprising the steps of:

storing data values with an array of bit cells;

generating bit line signals indicative of said data values on bit lines running through said array;

sensing said bit line signals with a plurality of sense amplifiers coupled to respective bits lines;

generating a timing signal indicating a delay period using a self timing path having one or more timing cells embedded within said array and serving to model a bit cell of said array changing a bit line signal on a bit line following a read access request; and activating at least some of said plurality of sense amplifiers to be responsive to respective bit line signals after said delay period following said read access request.

* * * * *